United States Patent [19]

Duvvury et al.

[11] Patent Number: 5,343,433
[45] Date of Patent: Aug. 30, 1994

[54] CMOS SENSE AMPLIFIER

[75] Inventors: Charvaka Duvvury, Missouri City; Adin E. Hyslop, Houston, both of Tex.

[73] Assignee: Texas Instruments Incorporated, Dallas, Tex.

[21] Appl. No.: 559,439

[22] Filed: Jul. 26, 1990

Related U.S. Application Data

[63] Continuation of Ser. No. 363,439, Jun. 7, 1989, abandoned, which is a continuation of Ser. No. 45,721, Apr. 27, 1987, abandoned, which is a continuation of Ser. No. 636,938, Aug. 2, 1984, abandoned.

[51] Int. Cl.$^5$ .......................... G11C 7/00; G11C 11/24
[52] U.S. Cl. ..................... 365/205; 365/149; 365/203; 365/210
[58] Field of Search ............... 365/203, 205, 207, 208, 365/210, 222

[56] References Cited

U.S. PATENT DOCUMENTS

| | | | |
|---|---|---|---|
| 4,418,293 | 11/1983 | McAlexander, III et al. | 365/205 |
| 4,618,947 | 10/1986 | Tran et al. | 365/238.5 |
| 4,860,255 | 8/1989 | Shimohigashi et al. | 365/205 |

FOREIGN PATENT DOCUMENTS 52-152128 12/1977 Japan.
54-112131 9/1979 Japan.

OTHER PUBLICATIONS

IBM Technical Disclosure Bulletin–vol. 25, No. 10 Mar. 1983 pp. 5088–5091.

Primary Examiner—Joseph L. Dixon
Assistant Examiner—Jack A. Lane
Attorney, Agent, or Firm—William E. Hiller; Richard L. Donaldson

[57] ABSTRACT

A CMOS sense amplifier circuit for a dynamic read/write memory employs cross-coupled N-channel transistors and cross-coupled P-channel transistors, returned to the voltage supply and ground through transistors activated by sense clocks. The differential inputs of the sense amplifier are connected to the bit lines through coupling transistors which are held on when the word line and dummy line go high, then are shut off while the sense amplifier is activated by the sense clocks; the coupling transistors are then turned on for selected columns before being turned on for non-selected columns. The current needed to charge and discharge the bit lines is thus spread out, and the peak current is decreased.

12 Claims, 8 Drawing Sheets

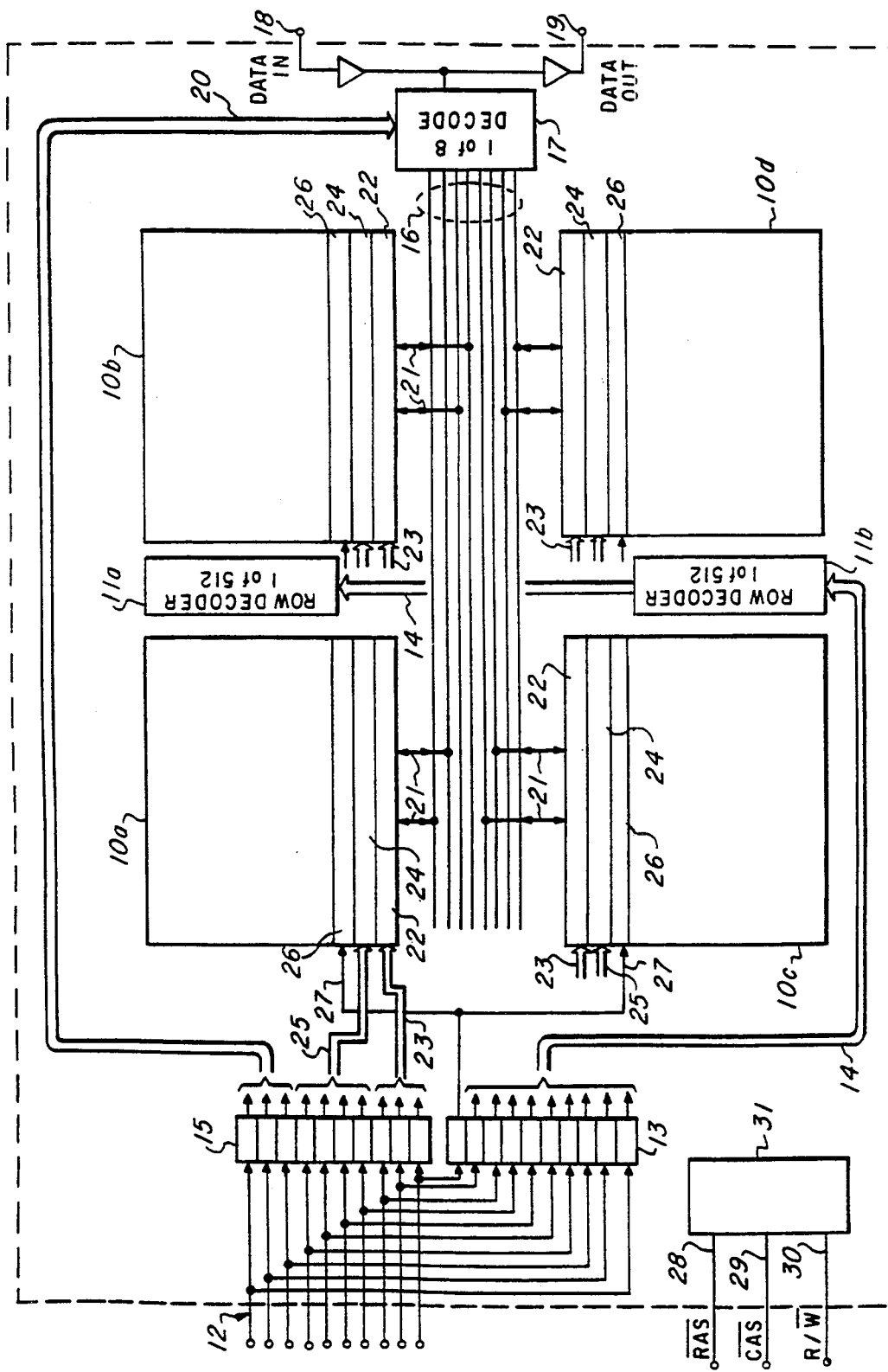

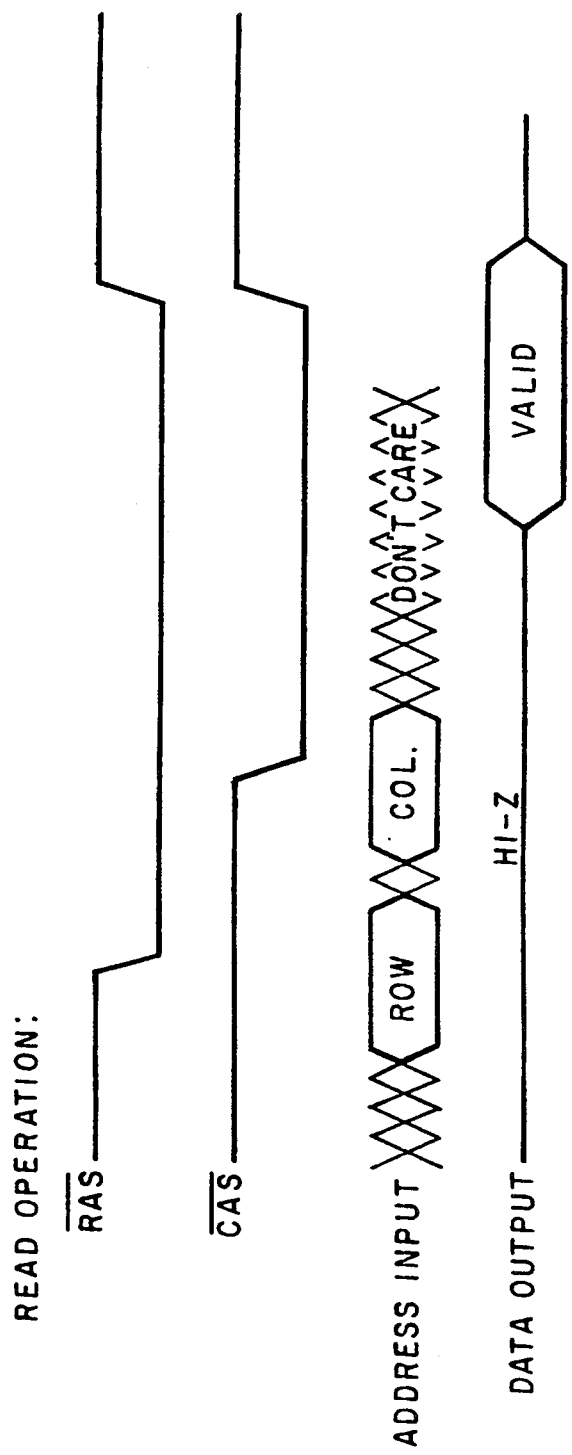

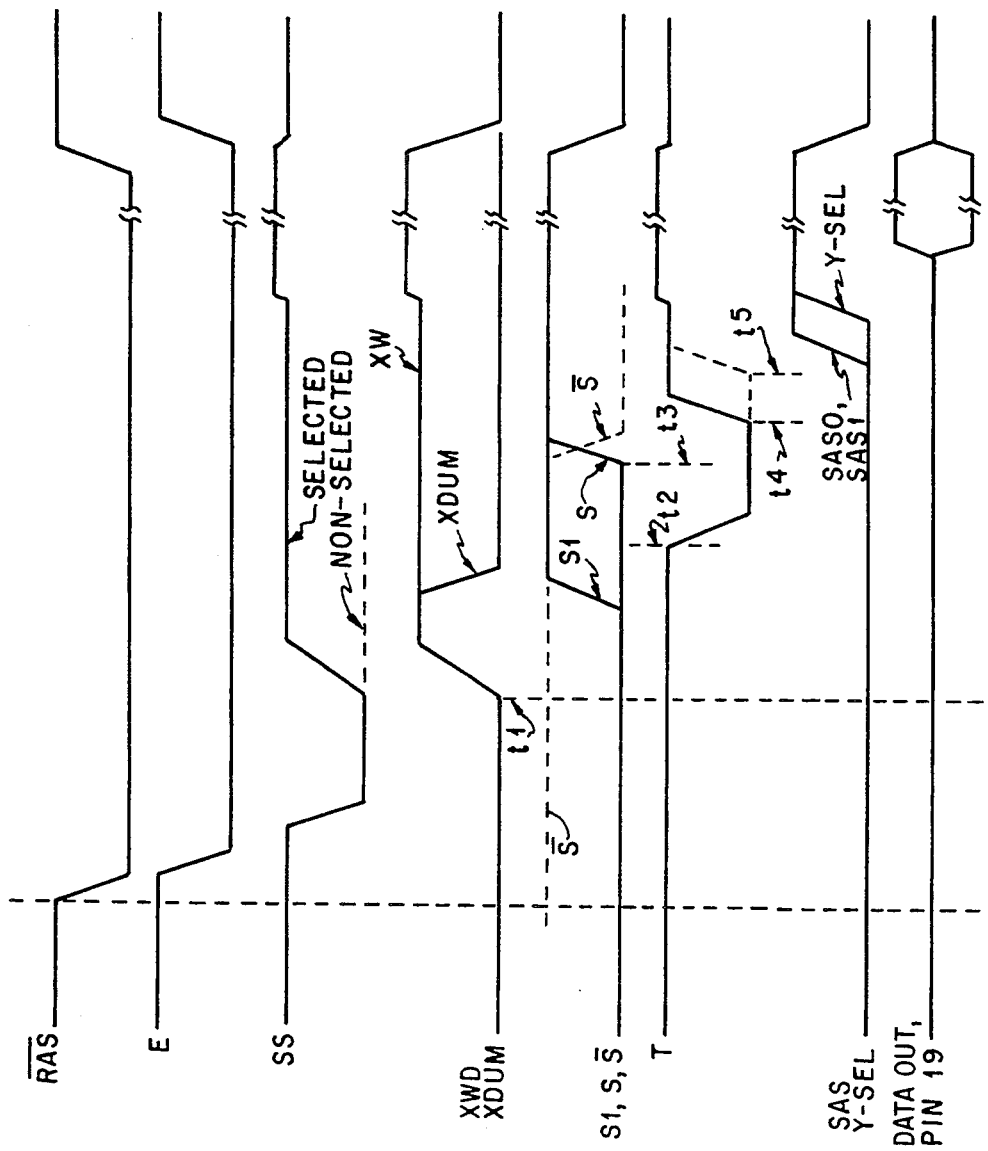

CMOS SENSE AMPLIFIER

RELATED CASES

This application is a continuation of application Ser. No. 07/363,439, filed Jun. 7, 1989, now abandoned, which is a continuation of application Ser. No. 07/045,721, filed Apr. 27, 1987, now abandoned, which is a continuation of application Ser. No. 06/636,938, filed Aug. 2, 1984, now abandoned.

BACKGROUND OF THE INVENTION

This invention relates to semiconductor devices, and more particularly to sense amplifier circuits for dynamic read/write memory devices.

Dynamic MOS read/write memory devices have been constructed generally as shown in U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, both assigned to Texas Instruments. When memory devices of this type are manufactured in higher densities, such as 256K and 1-Megabit and beyond, the problem of limiting the peak current supplied to the chip becomes formidable.

In a 1-Megabit DRAM that is refreshed at 512 per period, there are 2048 sense amplifiers which flip at the same time during an active cycle. Each one of these requires current to charge a bit line to Vdd, or discharge a bit line to Vss, or both, depending upon the precharge level. The voltage supply to the chip thus sees a very large current spike in a short time period; as the access time is increased, the magnitude of the current spike increases. In U.S. Pat. No. 4,050,061, issued to Nori Kitagawa, assigned to Texas Instruments, a technique is disclosed for limiting the peak current by partitioning the array into blocks and activating the sense amplifiers fully in only the addressed block; the other blocks are activated at a lower level and operate more slowly.

It is the principal object of this invention to provide an improved sense amplifier circuit for high density dynamic RAM devices, particularly for high-speed, low power devices. Another object is to provide a sense amplifier circuit for a CMOS dynamic RAM in which the peak current is minimized. A further object is to provide high speed, low current circuitry for semiconductor devices which contain bistable or latch circuits and the like.

SUMMARY OF THE INVENTION

In accordance with one embodiment of the invention, a CMOS sense amplifier circuit for a dynamic read/write memory employs cross-coupled N-channel transistors and cross-coupled P-channel transistors, returned to the voltage supply and ground through transistors activated by sense clocks. The differential inputs of the sense amplifier are connected to the bit lines through coupling transistors which are held on when the word line and dummy line go high, then are shut of while the sense amplifier is activated by the sense clocks; the coupling transistors are then turned on for selected columns before being turned on for non-selected columns. The current needed to charge and discharge the bit lines is thus spread out, and the peak current is decreased.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 3 is an electrical diagram in block form of a dynamic memory device of the 1-Megabit size which may use the sense amplifier circuit of the invention;

FIG. 3a is a timing diagram for the read or write operation of the memory of FIG. 3;

FIG. 7 is a timing diagram showing voltage vs. time for various nodes in the circuit of FIGS. 3-6.

DETAILED DESCRIPTION OF THE SPECIFIC EMBODIMENT

Figure 1:
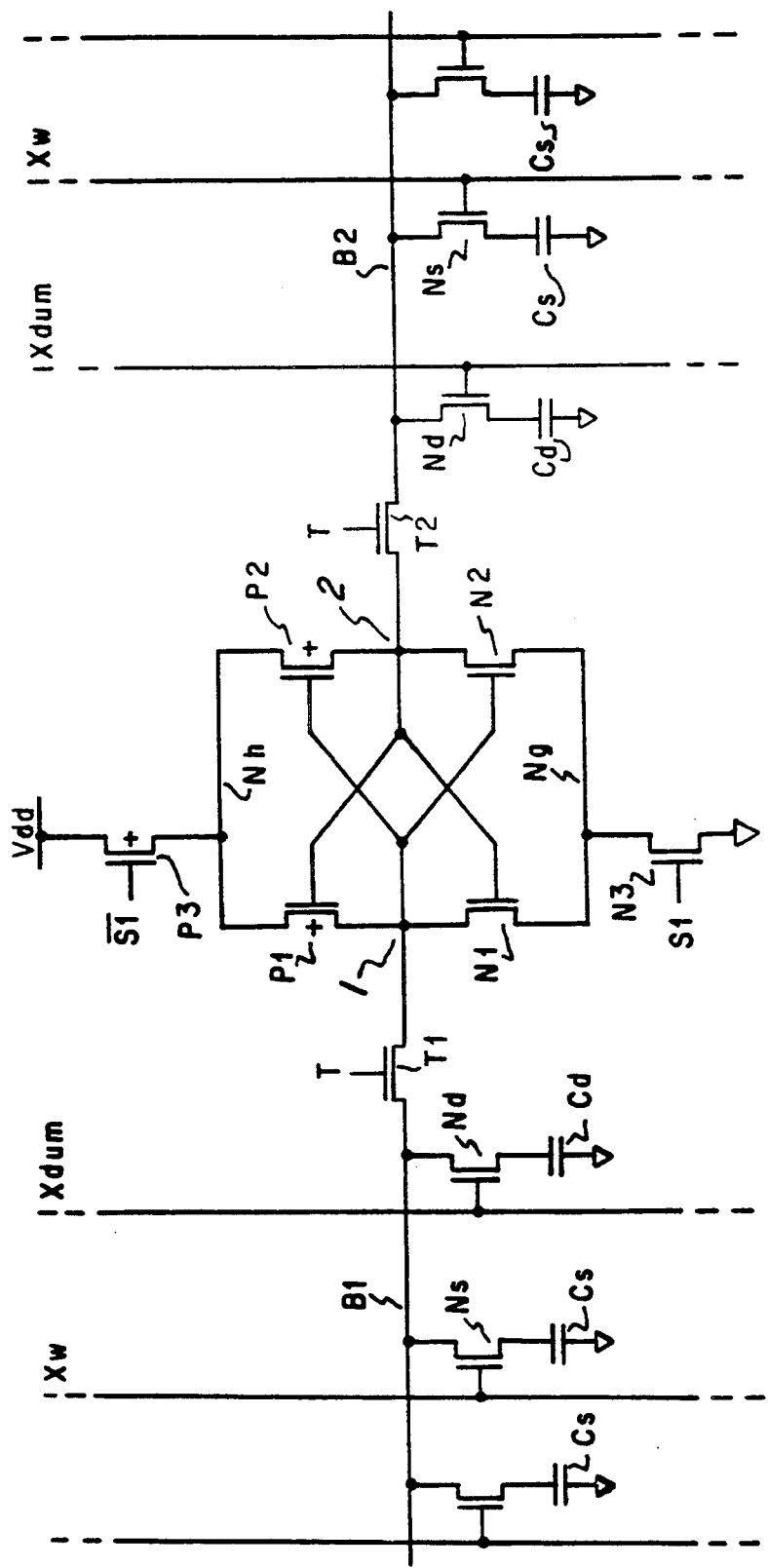
FIG. 1 is an electrical schematic diagram of a sense amplifier circuit according to the invention.

Referring to FIG. 1, a sense amplifier circuit for a dynamic RAM array is illustrated according to the invention. The sense amplifier employs a CMOS cross-coupled flip-flop circuit having a pair of N-channel driver transistors N1 and N2 and a pair of P-channel pull-up transistors P1 and P2. The N-channel transistors are coupled to ground through an N-channel transistor N3 having a sense clock S on its gate, and the P-channel transistors are coupled to Vdd through a P-channel transistor P3 having a sense clock $\overline{S}$, the complement of the sense clock S, on its gate. Sense nodes 1 and 2 at the drains of the N-channel transistors are coupled to bit lines B1 and B2 through transfer transistors T1 and T2, according to the invention. The transistors T1 and T2 have a clock T on their gates, functioning to decouple the sense nodes from the bit lines during the high-current part of the sensing operation to stretch out the current drain on the power supply, i.e., to reduce peak current.

The bit lines B1 and B2 are each coupled to a large number of one-transistor memory cells, each memory cell having a storage capacitor Cs and an N-channel access transistor Ns. One cell is selected by an Xw voltage on a word line. There is a dummy cell on each line, including a dummy capacitor Cd and an access transistor Nd. A dummy row line on the side opposite the selected word line is activated by an Xdum voltage.

Figure 2:
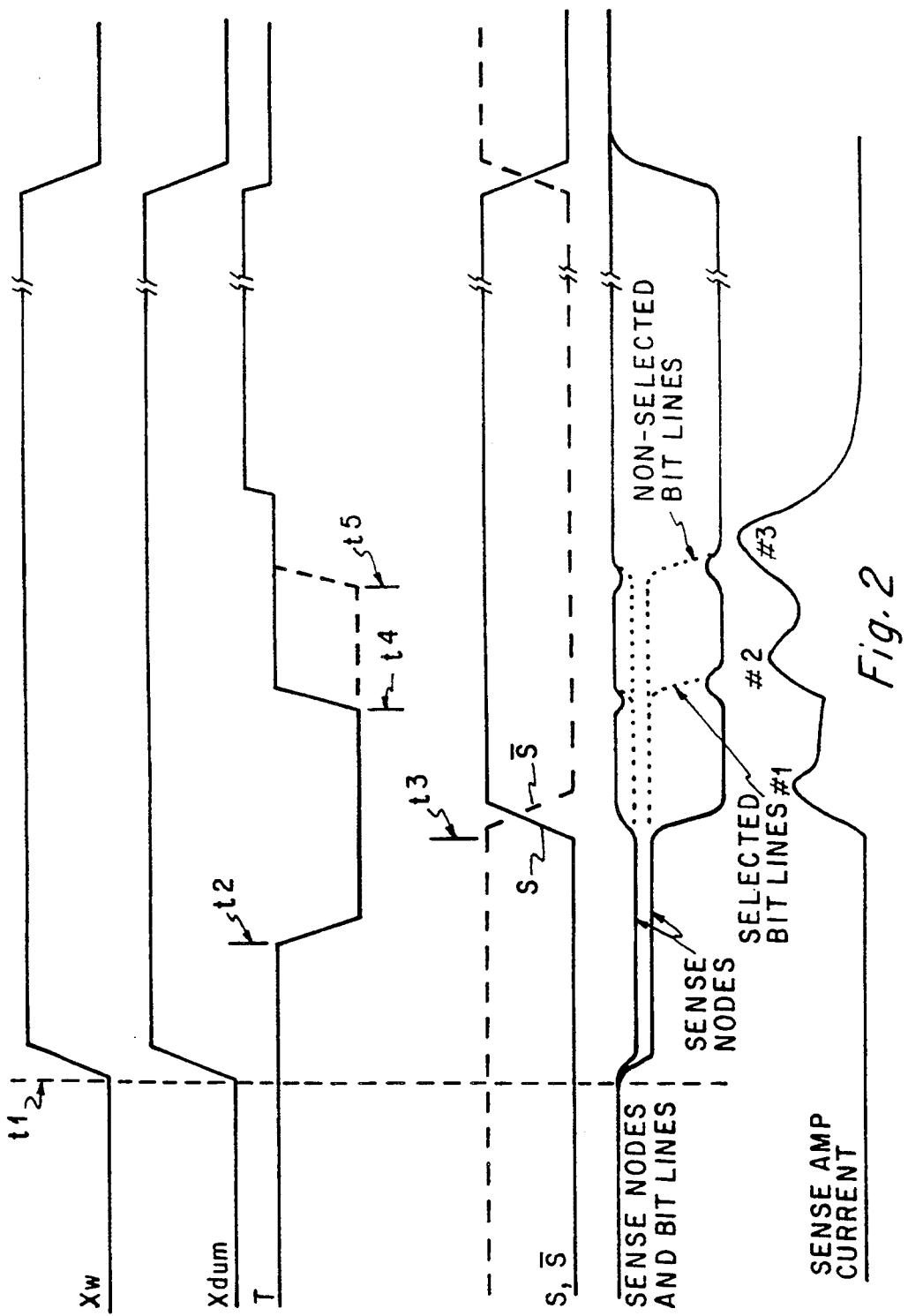
FIG. 2 is a timing diagram showing voltage vs. time for various nodes in the circuit of FIG. 1.

The sequence of operation of the elements of the sense amplifier of FIG. 1 is shown in the timing diagram of FIG. 2. The selected Xw and Xdum voltages go from zero to the Vdd level at time t1, turning on one transistor Ns and one transistor Nd, on opposite sides of the sense amplifier. This causes the bit lines B1 and B2 to charge-share with the storage capacitor Cs on one side and the dummy capacitor Cd on the other. The precharge level and size of these capacitors are such that the voltage on the bit line with Cs connected to it will be above or below the one on the dummy side, depending upon whether a 1 or a 0 is stored; the bit lines and sense nodes thus separate in voltage just after t1. At time t2, the T voltage drops from Vdd to zero, decoupling the bit lines B1 and B2 from the sense nodes 1 and 2. However, the voltage differential is maintained on the capacitance of the nodes 1 and 2 (including the gates of transistors N1, N2, P1, P2). At time t3 the sense clock S goes to Vdd, and $\overline{S}$ drops, turning on transistors N3 and P3 and causing the cross-coupled flip-flop circuit to operate; one of the nodes 1 and 2 drops rapidly to zero and the other goes to Vdd. There is only a slight current drain (current spike #1 in FIG. 2) at this point because the capacitances to be charged or discharged are small; the capacitance of the nodes 1 and 2 is much less than that of the bit lines B1 and B2. The transistors T1 and T2 must be turned back on to force the bit lines B1 and B2 to a full Vdd and zero level so that the selected capacitor Cs is restored to a full logic level. To this end, according to the invention, the voltage T goes back to Vdd at time t4 or t5, depending upon whether this is a selected column or not. When T goes high at T4 or T5, the zero-going bit line B1 or B2 discharges rapidly through N-channel transistor N1 or N2 to ground, and the one-going bit line is charged through P-channel transistor P1 or P2 from the Vdd supply (corresponding to current spikes #2 for t4 and #3 for t5, in FIG. 2). This charging or discharging generates voltage bumps on the sense nodes 1 and 2, but these bumps subside quickly before the data goes to the I/O circuitry.

The bit lines B1 and B2 are coupled to the data I/O circuitry by column select transistors, not shown. For the selected column or columns, the bit lines are driven rail-to-rail at time t4, so the data bit can be coupled from the bit lines to the data I/O circuitry for output from the chip. The other columns, not selected by the column decoder, are merely refreshed, so the time delay to t5 is of no disadvantage, because there is ample time before the end of an active read cycle. Here again, the voltage bumps introduced, corresponding to the current spike #3, decay in ample time before the word lines are turned off, thus restoring the data in the unselected cells.

The current flow into and out of the chip on the Vdd and Vss lines, isolated to the contribution by the sense amplifiers, is illustrated in FIG. 2. There is no current in the sense amplifiers until t3, and this current pulse #1 at t3 is small because the sense nodes 1 and 2 are small. At t4 and t5 there are current pulses #2 and #3, as the bit lines are charged and discharged, but the current is spread over a longer time, so the peak current is smaller. There would be, of course, other current peaks (not shown) when $\overline{RAS}$ drops, when $\overline{CAS}$ drops, and when $\overline{RAS}$ goes high (precharge begins).

Referring to FIG. 3, a block diagram of one example of a semiconductor dynamic read/write memory chip is illustrated which may use the sense amplifier circuit constructed according to another embodiment of the invention. This device is of the so-called 1-Megabit size, having 220 or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 and lines 14; the row decoders produce the row select voltage Xw as above. A 10-bit column address is also applied to the input pins 12, in time-multiplexed manner, and this column address is coupled to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in sixteen intermediate output buffers 22 for each block, using three bits of the column address on lines 23 from buffers 15. A 1-of-16 column selection is made in each of sixteen sets of sixteen intermediate output buffers 24 in each block 10a–10d, using four bits of the column address on lines 25 from buffers 15. Each one of 512 sense amplifiers 26 (like FIG. 1) in each block is connected to one of the columns in the array (each column is made up of two column line halves or "bit lines"). Each buffer 24 is coupled to one of two columns; this selection is based on one bit of the row address from buffers 13 on line 27.

The memory device receives a row address strobe $\overline{RAS}$ on input pin 28, and a column address strobe $\overline{CAS}$ on input pin 29. Selection of a read or a write operation is made by a $R/\overline{W}$ control on an input pin 30. A clock generator and control circuit 31 produces all of the internal clocks and controls as needed. For a single-bit read (or write), $\overline{RAS}$ and $\overline{CAS}$ drop to zero in sequence as illustrated in FIG. 3a, and a one-bit data read (or write) occurs.

Each block of the array contains two rows of dummy cells 32 in the usual manner, as discussed in the above-mentioned U.S. Pat. Nos. 4,239,993 or 4,081,701.

Figure 4:
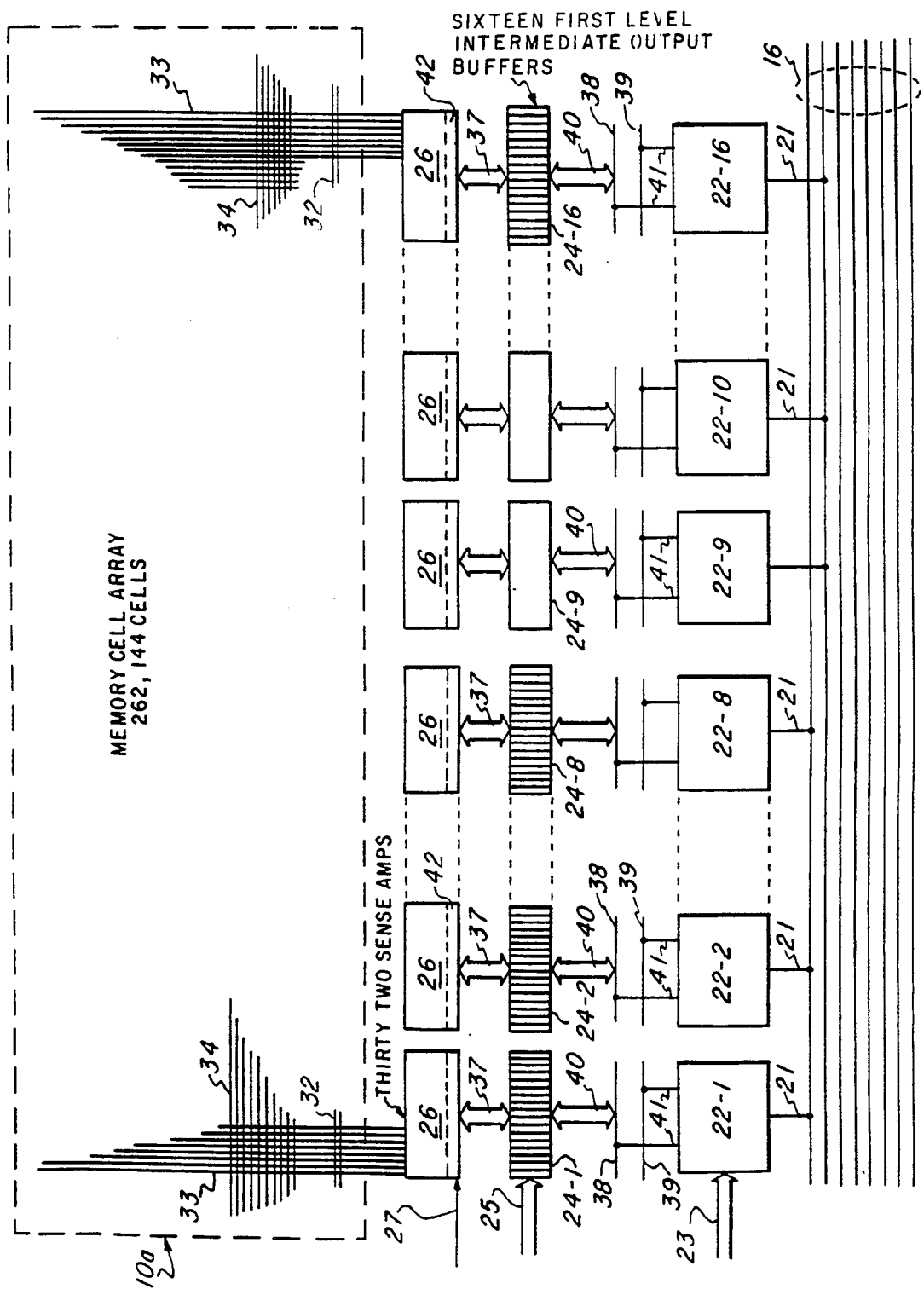
FIG. 4 is an electrical diagram in block form of a part of the memory device of FIG. 3.

Referring to FIG. 4, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the sixteen buffers 22-1 . . . 21-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33 (one column equals two bit lines, corresponding to the bit lines B1 and B2 of FIG. 1). Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective first level intermediate buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from double-rail at the lines 38 and 39 to single rail at the data I/O lines 16, for a write operation.

Figure 5:
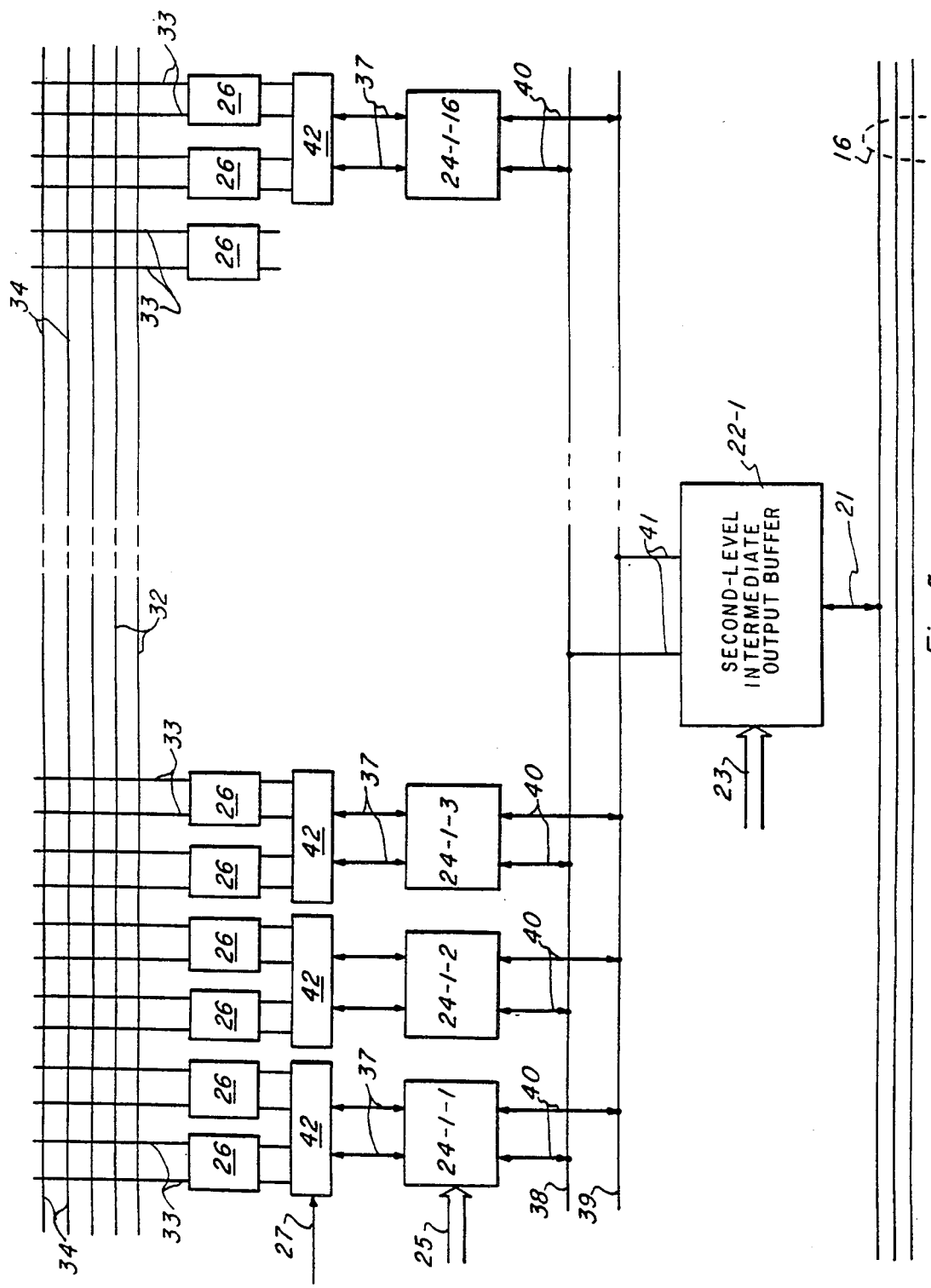
FIG. 5 is an electrical diagram in block form of a part of the circuitry of FIG. 4.

Referring to FIG. 5, a part of the circuitry of FIG. 4 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines 33 extending from it, in the so-called folded bit line configuration. Thus, all word lines 34 and both dummy rows 32 are on the same side of the sense amp. The row lines 34 intersect the bit lines, and memory cells are at intersections of row or word lines and bit lines just as in FIG. 1, but folded. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operating to couple a read-or-write bit of data to or from the lines 38, 39 by lines 40. The buffer 22-1 of FIG. 5 may or may not be selected by the 2-of-16 select provided by three bits on lines 23, for coupling the dual-rail I/O lines 38, 39 to the single rail I/O line 16 for this group.

Figure 6:
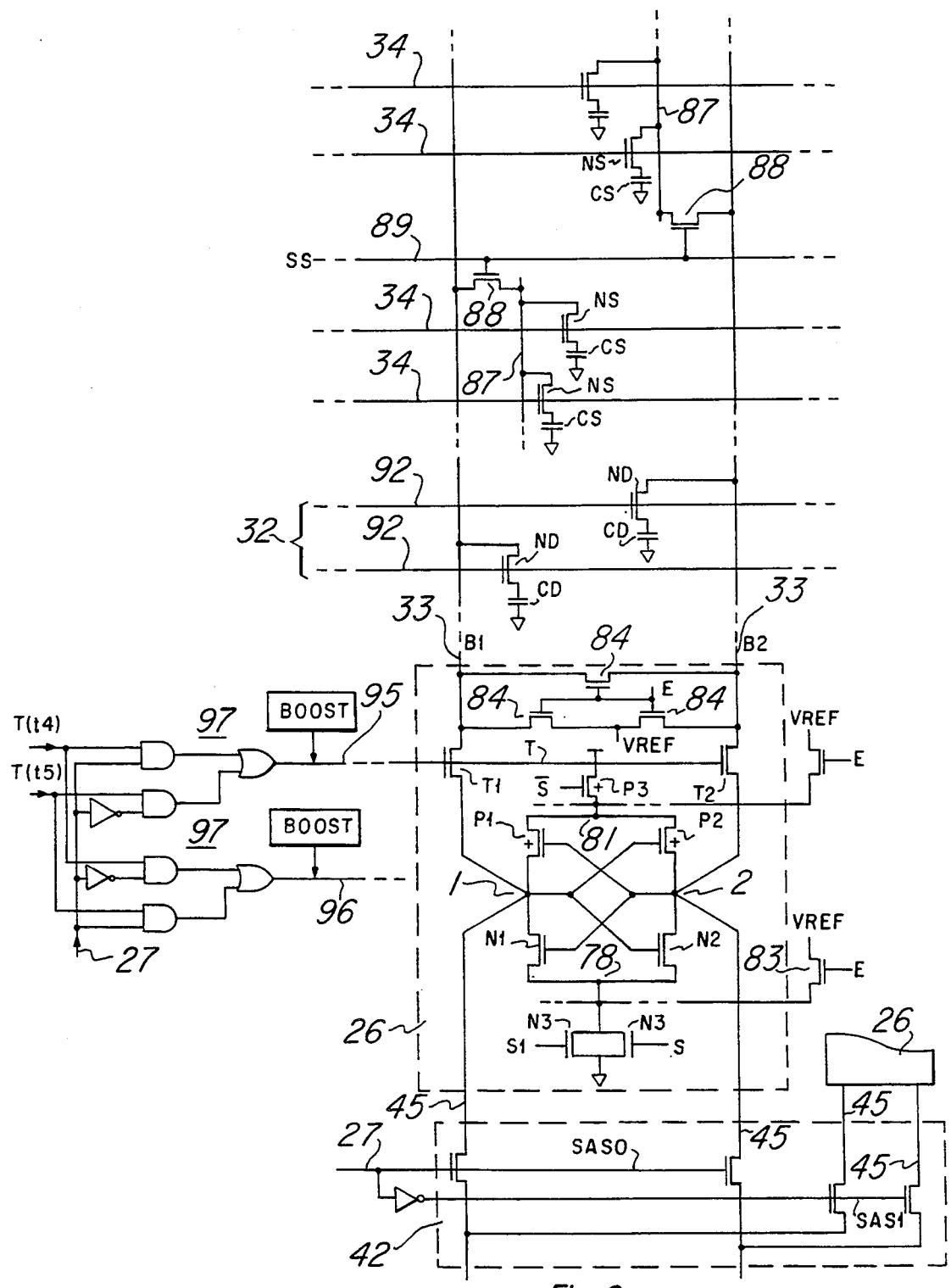
FIG. 6 is an electrical diagram in schematic form of the sense amplifier and cell array of FIGS. 3-5.

Referring to FIG. 6, one of the sense amplifiers 26 constructed according to the invention is shown in detail. This figure also shows the two bits lines 33 for this sense amplifier and four of the 512 row lines 34 perpendicular to these bit lines. The sense amplifier employs a CMOS cross-coupled flip-flop like FIG. 1 having N-channel driver transistor N1 and N2 and P-channel pull-up transistors P1 and P2. Sense nodes 1 and 2 are connected to bit lines 33 through the source-drain paths of isolating transistors T1 and T2. A node 78 on the ground side of this flip-flop is coupled to ground through two N-channel transistors N3, which have sense clocks S1 and S on their gates. The transistor N3 with S1 on its gate is much smaller than the other transistor N3, and clock S1 occurs first, so the initial sensing is a lower-gain condition, and is performed by N-channel transistors N1 and N2. On the Vdd side, a node 81 is coupled to the supply through a P-channel transistor P3, which has sense clock $\overline{S}$ on its gate. The sense clock $\overline{S}$ is the complement of S, so the P-channel transistor P3 starts to operate only after the clock S is activated. There is a two-interval sense operation, first S1 (at a low current level), then S and $\overline{S}$. The transistors N3 and P3 are shared with all of the other sense amplifiers 26 in two blocks 10a and 10b, i.e., 1024 sense amplifiers. The node 78 is precharged to about one-half Vdd by a transistor 83 when E is high.

The bit lines 33 are precharged and equalized through two transistors 84 which have an equalize clock voltage E on their gates; three of these transistors 84 have their sources connected to a reference voltage Vref. The value of this reference voltage is about half Vdd, so little or no net charge is needed from the chip supply Vdd to precharge all of the bit lines. That is, one line 33 will be high and the other low for each sense amplifier, so one will charge the other, and Vref need only supply any differential that might have occurred. The clock E is generated in the control circuitry after the end of an active cycle, when $\overline{RAS}$ goes high.

Each of the memory cells of FIG. 6 consists of a capacitor Cs and an access transistor Ns, just as in FIG. 1, with the gates of all of the 512 access transistors Ns in a row being connected to a row line 34. Only one row line 34 of 512 in the block is turned on at any one time, so only one memory cell capacitor Cs is connected to a bit line 33 for a given sense amplifier 26. According to the invention of application Ser. No. 634,898, filed Jul. 26, 1984, now U.S. Pat. No. 4,658,377 by David J. McElroy, assigned to Texas Instruments, in order to reduce the ratio of the bit line capacitance to the value of the storage capacitance Cs, a number of bit line segments 87 are employed for each pair of bit lines 33. One of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier (16×32=512). Half of the segments are connected to one bit line and half to the other. The row decoder 11a or 11b selects the appropriate one of sixteen lines 89 by a segment select voltage SS, at the same time as this decoder selects 1-of-512 row lines 34, based on certain ones of the same nine address bits from lines 14.

In the dummy rows 32, a pair of dummy cells are provided for each pair of bit lines 33, and these dummy cells consists of dummy capacitors Cd and access transistors Nd as before. When the selected storage cell is on the left-hand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Referring to FIG. 7, the sequence of operation of the memory device will be explained for a single-bit read operation. An active cycle begins with the $\overline{RAS}$ voltage dropping from +5 to zero. This example is a read cycle, so at this time the R/$\overline{W}$ input voltage is at +5. The time prior to this is a precharge cycle, during which the equalize voltage E has been high, so all of the bit lines 33 and the nodes 78, have been precharged to the Vref voltage, assumed to be about ½ Vdd or +2.5 volts. The segment select signal SS on all of the lines 89 is high, so all of the segments 87 are also precharged to the Vref voltage. The dropping of $\overline{RAS}$ causes the equalize voltage E to drop, isolating the pairs of bit lines 33 from each other and from Vref. The segment select signal SS then drops, isolating all of the segments 87 from the bit lines 33. As soon as the row decoders 11a, 11b have had time to respond to the row address, at time t1 the Xw and Xdum voltages start to rise on the selected 1-of-512 row line 34 and selected 1-of-2 dummy line 92; at the same time t1, the segment-select signal SS on one of the lines 89 is brought up. These address voltages Xw, Xdum and SS are brought up rather slowly, and later, some time after reaching the Vdd level, SS and Xw are boosted above Vdd to eliminate the Vt drop across the access transistors Ns and 88. The Xdum voltage falls, since the function of the dummy cells is completed during initial sensing, and the dummy capacitors can be decoupled from the bit lines so these capacitors can be precharged, as disclosed in copending application Ser. No. 630,507, filed Jul. 11, 1984 now U.S. Pat. No. 4,658,382 by Tran, McAdams and Childers, assigned to Texas Instruments. Before time t2, the sense amplifiers 26 are first (at low level) activated by the S1 voltage going high, turning on the high-impedance N-channel transistor N3; this begins to separate the bit lines 33 further than the separation caused by the differential voltages on the storage cell and dummy cell. However, before any significant current flows from the supply Vdd through transistors N1, N2, P1 and P2, the T voltage falls at t2, isolating the bit lines 33 from the sense nodes 1 and 2. After the T voltage falls, the sense clock S is brought up at t3, so the large transistor N3 begins to conduct; also $\bar{S}$ drops, so the P-channel load transistor P3 begins to conduct. At this time the current spike #2 of FIG. 2 occurs (note that the circuit may also be constructed so that S1 goes high after T drops.) After S rises and $\bar{S}$ drops, the T voltage is brought up to Vdd at time t4 or t5, as previously discussed. After the isolating transistors T1 and T2 have been turned back on, the bit lines are forced to a rail-to-rail condition; one bit line 33 is high and the other at zero. The sense-amp-select voltage SAS1 or SAS2 (selected by address bit 27) is turned on, connecting one of the sense amplifiers to a buffer 24 via lines 37 of FIG. 5, using the multiplexer 42. Just after this the Y-select outputs from column decoders are valid, so the selected data bit become valid on the line 16, and shortly thereafter the data bit is valid on the output pin 19.

Selection of which of the times t4 or t5 the T voltage is brought up is based upon an address bit. In the embodiment of FIGS. 3-7 there are 2048 sense amplifiers; half of these (including the selected columns) may receive the T voltage rising at t4, the other half at t5. One way of accomplishing this is by using the address bit on line 27, the same one used in the multiplexer 42 that selects the sense amplifier 26 for connection to the I/O circuitry. As seen in FIG. 6, all of the sense amplifiers selected by SAS0 have the T voltage applied by line 95, and those selected by SAS1 receive the T voltage from line 96. A pair of logic gates 97 receiving the address bit 27 and its complement, and the two T voltages (terminating at t4 or t5), apply the proper voltage to the transistors T1 and T2. The current pulse for charging and discharging all of the 2048 pairs of bit lines is thus spread over twice the time, reducing peak current. The T voltage is boosted above Vdd (by circuitry not shown) to assure a full Vdd level written to the 1-going cell.

When this invention has been described with reference to illustrative embodiments, this description is not intended to be construed in a limiting sense. Various modifications of the illustrative embodiments, as well as other embodiments of the invention, will be apparent to persons skilled in the upon reference to this description. It is therefore contemplated that the appended claims will cover any such modifications or embodiments as fall within the true scope of the invention.

What is claimed:

1. A CMOS amplifier circuit for a memory device comprising:
   a pair of bit lines, and a plurality of dynamic memory cells separately connected to each of said pair of bit lines,
   a cross-coupled flip-flop circuit including a first pair of N-channel transistors and a second pair of P-channel transistors, each transistor having a source-to-drain path and a gate, the source-to-drain paths of the first pair of transistors connected between a pair of sense nodes and a grounding node, the source-to-drain paths of the second pair of P-channel transistors connected between said sense nodes and a voltage supply node,
   a pair of coupling transistors having source-to-drain paths separately connecting said pair of sense nodes to said pair of bit lines, and having gates connected to control circuitry,
   a third pair of N-channel transistors each having a source-to-drain path and a gate, the source-to-drain paths of the third pair of N-channel transistors being connected in parallel between said grounding node and a ground terminal of a voltage supply, the gates of said third pair of N-channel transistors being connected to said control circuitry,
   a P-channel pull-up transistor having a source-to-drain path connecting said voltage supply node to a positive voltage supply, and having a gate connected to said control circuitry,
   said control circuitry applying activating voltages in sequence to said gates of said third pair of N-channel transistors, and applying an activating voltage to said gate of said P-channel pull-up transistor, and applying an activating voltage to said gates of said coupling transistors in an active cycle during a time period that said memory cells are activated for coupling to said bit lines, then applying a deactivating voltage of substantially zero to said gates of said coupling transistors in said active cycle during a time period that at least one of said gates of said third pair of N-channel transistors is activated by said control circuitry, and thereafter applying an activating voltage again to said gates of the coupling transistors.

2. A circuit according to claim 1 wherein said pair of coupling transistors are N-channel.

3. A circuit according to claim 1 wherein said control circuitry activates the gates of said coupling transistors at a variable time delay after said grounding means are activated, depending upon an address applied to said memory device.

4. A circuit according to claim 1 wherein said memory cells are one-transistor dynamic MOS read/write memory cells.

5. In a semiconductor memory having at least two blocks of memory cells, each of said cells of each of said blocks selectively storing an electric charge, each block having a set of sense amplifiers, each sense amplifier connected to a line of memory cells in its block to selectively amplify the charge stored in individual memory cells in its line of memory cells, switch means in the connections between each sense amplifier and its line of memory cells to temporarily disconnect each sense amplifier from its line of memory cells during an amplification operation and then to reconnect each sense amplifier to its line of memory cells, the switch means including a selectible time control that effects the reconnection in the cell block containing a selected cell before the reconnection in the other blocks of memory cells,
   in which the sense amplifier has a power supply connection, and a clock circuit is connected to open said power supply connection before the switch means disconnects the cell line, to then close the power supply connection while the cell line is still disconnected, and to subsequently cause the reconnection of the cell lines, 6. The combination of claim 5 in which there is a clock generator connected to supply cycles of different timing pulses, one such pulse being timed to initiate a cell line disconnect in all the memory blocks, and a set of later pulses each to a different cell block, said set initiation being responsive to a cell designation signal to first initiate cell line reconnects in the block having the designated cell, and later to initiate cell line reconnects in the remaining blocks.

7. The combination of claim 5 in which the memory has more than two blocks of memory cells and the selectable time control is constructed to separately reconnect the sense amplifiers of the different blocks to their sets of memory cell lines, and to effect each block reconnect at a different time.

8. The combination of claim 5 in which the memory is constructed for operation by an electric potential of a given supply voltage but the switch means is constructed to effect its switching with a switching potential of above said given supply voltage.

9. A CMOS sense amplifier circuit for a dynamic memory device, comprising:

a pair of bit lines, and a plurality of dynamic memory cells separately connected to each of said pair of bit lines, a cross-coupled flip-flop circuit including a first pair of N-channel transistors and a second pair of P-channel transistors, each transistor having a source-to-drain path and a gate, the source-to-drain paths of the first pair of N-channel transistors connected between a pair of sense nodes and a grounding node, the source-to-drain paths of the second pair of P-channel transistors connected between said sense nodes and a positive voltage supply node, said gates of the first pair of N-channel transistors and the second pair of P-channel transistors being cross-coupled to said pair of sense nodes, said sense nodes being coupled to said pair of bit lines, a third pair of N-channel transistors each having a source-to-drain path and a gate, the source-to-drain paths of said third pair of transistors being connected in parallel between said grounding node and a ground terminal of a voltage supply, one of said third pair being smaller than the other, a P-channel pull-up transistor having a source-to-drain path and a gate, the source-to-drain path of the pull-up transistor being connected between said positive voltage supply node and a positive terminal of said voltage supply, and control circuitry connected to said gates of said third pair of N-channel transistors and to said gate of said P-channel pull-up transistor to apply activating voltages to said gates during an active cycle, said control circuitry applying an activating voltage to the gate of said one of said third pair at a given time in said active cycle while a selected one of said memory cells is activated for coupling to a bit line and to one of said sense nodes, said control circuitry applying activating voltages to the gates of the other of said third pair and to said gate of said P-channel pull-up transistor in said active cycle after said given time.

10. A sense amplifier circuit according to claim 9 wherein said sense nodes are coupled to said pair of bit lines by source-to-drain paths of a fourth pair of N-channel transistors, and gates of said fourth pair are connected to said control circuitry to receive an activating voltage which is at a zero level to render said fourth pair non-conductive for a time period in the active cycle after said given time and conductive following said time period.

11. A sense amplifier according to claim 10 wherein said time period includes the time that said activating voltages are applied to the gates of said other of said third pair and to the gate of said P-channel pull-up transistor.

12. A sense amplifier circuit according to claim 9 wherein said activating voltage applied to the gate of said P-channel pull-up transistor is obtained by inverting said activating voltage applied to the gate of said other of said third pair.

* * * * *